United States Patent [19]

Thompson

[11] 3,802,069

[45] Apr. 9, 1974

[54] FABRICATING PACKAGES FOR USE IN INTEGRATED CIRCUITS

[75] Inventor: David F. Thompson, Warren, Pa.

[73] Assignee: GTE Sylvania Incorporated, Seneca Falls, N.Y.

[22] Filed: May 4, 1972

[21] Appl. No.: 250,426

[52] U.S. Cl. .................................... 29/627, 29/588

[51] Int. Cl. .............................................. H05k 3/28

[58] Field of Search .......... 29/576 S, 588, 589, 626, 29/627

[56] References Cited

UNITED STATES PATENTS

| | | | |
|---|---|---|---|
| 3,577,633 | 5/1971 | Homma | 29/588 |
| 3,689,336 | 9/1972 | Bunker et al. | 29/589 |
| 3,716,764 | 2/1973 | Birchler et al. | 29/588 |

*Primary Examiner*—W. C. Tupman
*Attorney, Agent, or Firm*—Norman J. O'Malley; Donald R. Castle; William H. McNeill

[57] ABSTRACT

There is disclosed an improvement to a process for fabricating packages suitable for use in integrated circuits wherein at least two connecting leads of an electrically conductive member are left affixed to the conductive member's central pad during fabrication of the conductive member. This improved process substantially reduces possible pad misalignment and damage during these fabrication steps. Prior to ceramic encapsulation of major portions of these connecting leads as well as additional component leads, one of the connecting leads is severed from the pad and the pad is then offset.

4 Claims, 4 Drawing Figures

PATENTED APR 9 1974 3,802,069

FABRICATING PACKAGES FOR USE IN INTEGRATED CIRCUITS

BACKGROUND OF THE INVENTION

This invention relates to integrated circuits and more particularly to a process for fabricating packages for use in such circuits.

Integrated circuit packages having an electrically conductive member and a ceramic portion are well known in the art. Most usually, the electrically conductive member comprises a frame portion which extends about the perimeter of the package. A plurality of individual component leads are each attached to the frame and extend inwardly from the frame toward a central pad, where they each are spacedly positioned a predetermined distance from the pad. Additionally, at least one connecting lead is provided which is joined at one end to the pad and at another end to the frame, this lead supplying the grounding means for the eventual circuit. The ceramic portion of packages of this variety is provided primarily to maintain lead alignment of the package and to protect the leads from damage as a result of possibly injurious environmental conditions either during handling or operation of the circuit package.

The intermediate package described herein is not the final package since after the fabrication described herein, the circuit component, usually a semiconductor, is placed in position upon the pad, connected to the component leads, and thereafter sealed in the unit. The frame portion is removed before final use. These latter steps are usually provided by the manufacturers of the integrated circuits, rather than by the manufacturers of the intermediate package.

Fabrication of the previously described packages requires initially a step in which the conductive member is formed, i.e., by stamping or chemical etching, after which it is cleaned, and then oxidized. The member is then aligned within a package mold with an upper and lower ceramic preform whereupon heat is introduced, causing the preforms to become molten and form about portions of the previously described leads. As is readily understood, the relatively small nature of packages of this variety dictates the necessity for highly accurate aligning of these components as well as the need for extreme care in handling during these manufacturing processes.

A particular problem in the assembly of prior art packages has been the inability of the central pad portion of the conductive member to maintain the desired alignment with the leads and frame portion of the member prior to final package assembly. Misalignment of the pad often resulted in damage to the pad as well as to the remaining components of the conductive member as the member passed through the various prepackaging phases of the fabrication process.

To eliminate this misalignment problem, manufacturers of these packages most usually chose one of two methods. Either all the leads were left connected to the central pad until the package was substantially assembled whereupon all but one was severed from the pad, or at least two supportive members, better known as tie bars, were connected from the frame to the pad thereby assuring alignment. In the previous method, severing all but one of the leads in the assembled package was accomplished either by stamping, electrical discharge, or chemical action. The main disadvantages of using electrical discharge or chemical action was that this step necessitated an additional step for removal of the severed material.

Additionally, when stamping, the end result was often damage to the brittle package body. When using tie bars, additional manufacturing steps were also necessary to properly align the bars with the frame, and then to join them, usually by welding. Furthermore, upon completion of assembly of the package, the ends of the tie bars protruding beyond the package body required shearing off, once again often resulting in damage to the brittle package body.

It is believed, therefore, that a method for fabricating packages for use in integrated circuits in which the central pad of the package's conductive member is retained in alignment with the remaining components of the member prior to insertion into the package mold would be an advancement in the art.

OBJECTS AND SUMMARY OF THE INVENTION

It is an object of this invention to provide an improved process for fabricating packages for use in integrated circuits.

It is a further object of this invention to provide an improved process whereby the central pad of the electrically conductive member is retained in alignment with the leads and frame portion of the member during the initial fabricating steps of the package.

In accordance with one aspect of this invention there is provided an improvement to a process for fabricating a package suitable for use in integrated circuits. The package comprises an electrically conductive member having a frame portion, a central pad, a plurality of individual component leads joined to the frame portion and extending toward the central pad, from which they are spacedly arranged, and at least one connecting lead joined at one end to the frame and at the other end to the central pad. The package also comprises a ceramic portion which serves as a hermetic seal about a major portion of each of the component leads and the connecting lead. The frame, the pad, and minor portions of the leads are left exposed for subsequent assembly. The improvement comprises fabricating the electrically conductive element with at least two leads connected to the central pad. Prior to insertion into the package mold for alignment with the forementioned ceramic performs, one of te leads is severed and the pad is offset. The molding operatin then occurs with the molten ceramic encapsulating major portions of the leads.

DESCRIPTION OF THE PREFERRED EMBODIMENTS

For a better understanding of the present invention, together with other and further objects, advantages and capabilities thereof, reference is made to the following disclosure in conjunction with the appended claims and accompanying drawings.

Figure 1:
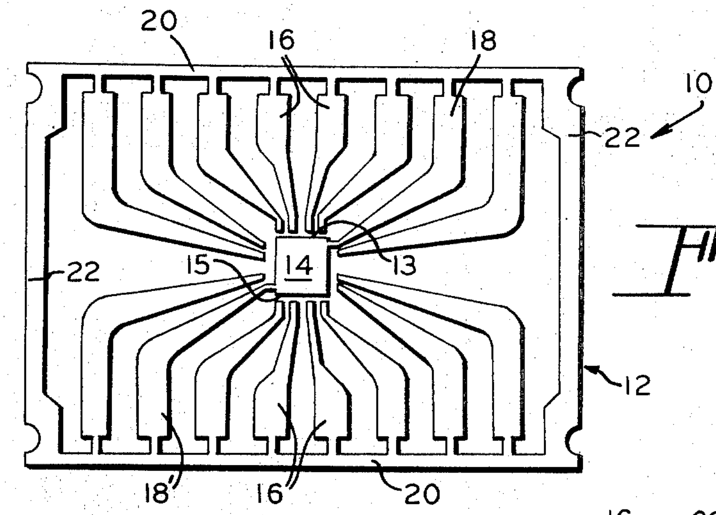
FIG. 1 is a plan of an electrically conductive member produced in accordance with the subject invention.

With particular reference to FIG. 1, there is shown the electrically conductive member 10 as utilized in accordance with the present invention. Conductive member 10 comprises an exterior frame portion 12, a central pad 14, a plurality of individual component leads 16, and at least two connecting leads 18 and 18'. Frame portion 12 can be further described as comprising a pair of opposing lead support sides 20 and a pair of opposing tying sides 22 which interconnect support sides 20. Component leads 16 are commonly joined at one end to one of the support sides 20 and extend inwardly from sides 20 toward pad 14 where they each are spacedly arranged a predetermined distance from the pad. In similar manner, connecting leads 18 and 18' are each joined at one end to a corresponding support side 20 where they too extend inwardly toward pad 14. However, unlike component leads 16, connecting leads 18 and 18' are rigidly affixed to pad 14, as illustrated.

A typical center-to-center spacing for leads 16, 18, and 18' as they are attached to support sides 20 is about 50 or 100 mils, depending on the number of leads required. Central pad 14 normally has a surface area of approximately 200 mils by 200 mils and forms the bed for the circuit component, usually a semiconductor, which is affixed thereto in the final steps of assembling the integrated circuit. As can be appreciated, the relatively small size of pad 14 and leads 16, 18 and 18' necessitates extreme care during the handling and manufacturing phases of member 10. Furthermore, it can be readily understood that alignment of these parts, particularly pad 14, is critical to the proper functioning of the ultimate product. After forming conductive member 10 utilizing any of the previously mentioned chemical or mechanical processes, the member is then subjected to various cleaning and oxidizing steps prior to final package assembly. Connecting leads 18, affixed as illustrated, assure that pad 14 maintains the required alignment during these preparatory steps. Although the method illustrated is to have connecting leads 18 and 18' diagonally affixed to pad 14, several other positioning arrangements for attaching these leads are satisfactory. For example, instead of leads 18 and 18', two other leads could be employed and affixed in a more directly opposing relationship on surfaces 13 and 15 respectively of pad 14.

Figure 2:
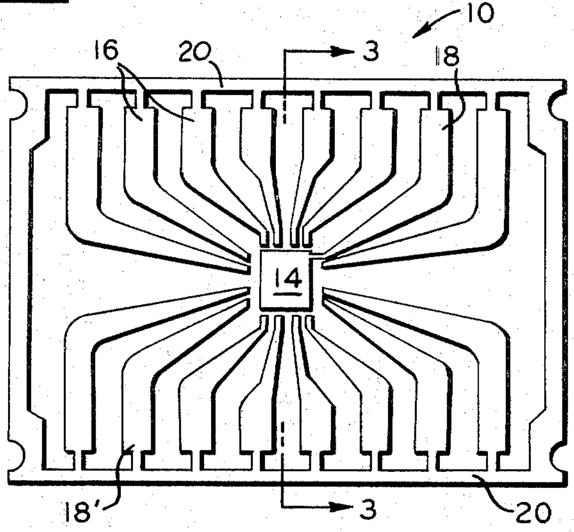
FIG. 2 is plan view of the member of FIG. 1 with one of the connecting leads removed.
Figure 3:
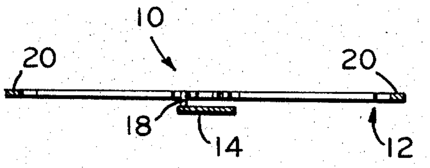
FIG. 3 is a side view of the conductive member as taken along the line 3—3 in FIG. 2.
Figure 4:
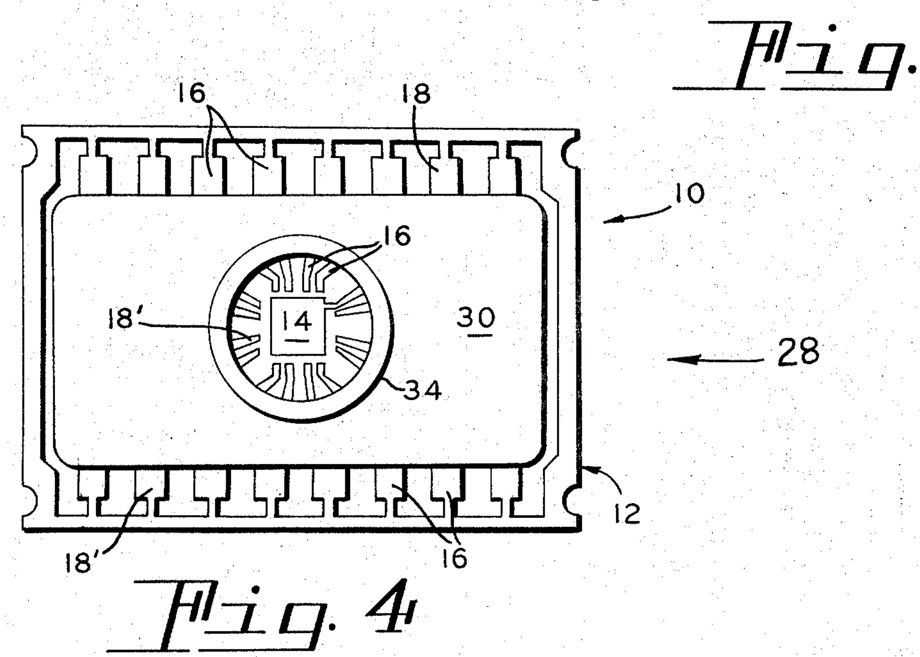
FIG. 4 is a plan view of the assembled package after the ceramic portion has been formed.

In FIGS. 2 and 3, conductive member 10 has completed the necessary cleaning and oxidizing steps and is prepared for the molding step in which the ceramic preforms are aligned and formed about major portions of leads 16, 18 and 18' (illustrated in FIG. 4.) Connecting lead 18' has been severed from pad 14 and the pad has been offset from the plane of the leads. The now offset pad will align with a corresponding indented portion in one of the ceramic preforms, as is standard in packages of this variety. To accomplish the severance of lead 18', several methods may be employed. A method preferred by applicant is a simple mechanical operation which includes a shearing step, this occurring just prior to offsetting the pad. This step can easily be accomplished by only minor alterations to the operating cycle and components of the machine utilized in the offset cycle.

In FIG. 4, the completed intermediate package 28 is illustrated and shown to comprise the electrically conductive member 10 and a ceramic portion 30. Segment 34 of the ceramic portion extends to a base (not shown) and is physically bound by the rest of the ceramic portion 30. Ceramic portion 30 is shown to encapsulate a major portion of leads 16 and 18 and 18'. Final assembly of the package for use in an integrated circuit will include severing frame 12 from the individual leads, affixing a circuit element to pad 14 and electrically joining the element to the spaced ends of leads 16 and 18', and hermetically sealing the element in the package by affixing a cover member atop segment 34.

Thus, there has been shown and described an improvement to the process for fabricating a package for use in integrated circuits, the improvement comprising leaving at least two connecting leads affixed to the central pad of the conductive member during fabrication of the member. By doing so, proper alignment of the pad with corresponding leads in the member is assured.

While there has been shown and described what is at present considered the preferred embodiment of the invention, it will be obvious to those skilled in the art that various changes and modifications may be made therein without departing from the scope of the invention as defined by the appended claims.

What is claimed is:

1. In a process for fabricating a package suitable for use in integrated circuits wherein said package comprises an electrically conductive member comprising a frame portion extending around the perimeter of said package, a central pad, a plurality of individual component leads spaced apart from said pad and joined to said frame portion, and at least one connecting lead joined at one end to said central pad and at another end to said frame portion, and a ceramic portion serving as a hermetic seal about a major portion of each of said component leads and said connecting lead, the improvement comprising:

fabricating said electrically conductive member having only two of said connecting leads affixed to said central pad in an opposing relationship to thereby assure alignment of said central pad;

severing one of said connecting leads from said central pad and offsetting said pad; and encapsulating said major portions of said leads in said ceramic portion.

2. The improvement according to claim 1 wherein severing one of said connecting leads from said pad is accomplished by a shearing operation.

3. The improvement according to claim 2 wherein the center-to-center spacing between said individual component leads at said frame is about 50 mils.

4. The improvement according to claim 2 wherein the center-to-center spacing between said individual component leads at said frame is about 100 mils.

* * * * *